United States Patent [19]

Kusumi et al.

[11] Patent Number: 4,882,827
[45] Date of Patent: Nov. 28, 1989

[54] PROCESS FOR PRODUCING GLASS MOLD

[75] Inventors: Yasuo Kusumi, Akishima; Ken Uno, Bunkyo; Takuo Fujino, Akishima, all of Japan

[73] Assignee: Hoya Corporation, Tokyo, Japan

[21] Appl. No.: 244,499

[22] Filed: Sep. 15, 1988

[30] Foreign Application Priority Data

Sep. 28, 1987 [JP] Japan ............................... 62-243009

[51] Int. Cl.$^4$ ............................................ B23P 17/00
[52] U.S. Cl. ................................ 29/527.2; 65/374.1; 65/374.13; 65/374.15; 427/34
[58] Field of Search ................... 29/527.2; 65/374.13, 65/374.15, 374.1; 427/34

[56] References Cited

U.S. PATENT DOCUMENTS

| | | | |
|---|---|---|---|
| 3,486,878 | 12/1969 | Greenler | 65/374.13 X |
| 3,833,347 | 3/1973 | Angle et al. | 65/374.15 X |
| 3,979,196 | 9/1976 | Frank et al. | 65/374.15 X |
| 4,139,677 | 2/1979 | Blair et al. | 65/374.1 X |
| 4,168,961 | 9/1979 | Blair | 65/374.1 X |
| 4,590,031 | 5/1986 | Eichen et al. | 65/374.13 X |
| 4,606,750 | 8/1986 | Torii et al. | 65/374.15 X |

FOREIGN PATENT DOCUMENTS 183134 of 1986 Japan.
281030 of 1986 Japan.
62-158864 7/1987 Japan .................................... 427/34

OTHER PUBLICATIONS

J. Amer. Ceram. Soc., vol. 54, No. 12, pp. 605-609, (1971), by Kaae et al.

Primary Examiner—Carl J. Arbes
Attorney, Agent, or Firm—Nixon & Vanderhye

[57] ABSTRACT

According to the present process for producing a glass mold, a base for a glass mold to be produced is subjected to a sputtering treatment using an inert gas and graphite as a target at a mold base temperature of 250°–450° C., and thereby is formed on the mold base a hard carbon film having excellent adhesion to the mold base and excellent hardness and being unliable to cause fusion bonding to a molded glass article produced. Accordingly, the glass mold produced according to the present process has excellent durability and excellent glass releasability.

6 Claims, 1 Drawing Sheet

PROCESS FOR PRODUCING GLASS MOLD

BACKGROUND OF THE INVENTION

1. Field of the Invention

The present invention relates to a process for producing a glass mold. The glass mold obtained according to the process of the present invention can be preferably used for producing a molded glass article of high precision requiring no further post-operations (e.g. grinding or polishing) after molding.

2. Prior Art

Molds used for producing a molded glass article by press molding are required to cause no surface roughening due to the oxidation at high temperatures such as 300°–700° C. at which press molding is normally conducted, and to invite no fusion bonding of molded glass article to the mold after press molding. Said molds are further required to be processable at the inner surface to an optical mirror surface and to have mechanical strengths sufficient to withstand the impact applied at the time of press molding.

As materials for such glass molds, there have conventionally been used tungsten carbide (WC), a tungsten carbide (WC) - cobalt (Co) alloy and various cermets. These materials, however, cause surface roughening due to oxidation at high temperatures. As a material for a glass mold causing no surface roughening at high temperatures and processable at the inner surface into a mirror surface, there can be mentioned a SiC film obtained by a CVD method. However, this mold material, when made into a glass mold, invites fusion bonding of glass under press molding at high temperatures of 400° C. or above.

Hence, in order to prevent fusion bonding of glass to a glass mold, a releasing film of carbon is formed on the surface of the mold. The releasing film of carbon includes various types such as (1) a diamond film, (2) a diamond-like carbon film, (3) a glassy carbon film and (4) a graphite film; however, each of these films has the following problems. The diamond film (1) has a high hardness and a relatively high adhesion to a $\beta$-SiC film formed on a mold base; however, with respect to this diamond film, (a) the mold surface cannot be made into an optical mirror surface because it is impossible to obtain a diamond film consisting of very fine diamond particles of uniform size, and (b) the film removal necessary for the reclamation of mold cannot be effected by ashing according to the plasma oxidation method.

The diamond-like carbon film (2) is formed using a reactive gas consisting of $CH_4$ and $H_2$ as disclosed in Japanese Patent Application Kokai (Laid-Open) No. 281030/1986; accordingly, it is difficult to obtain this film in such thinness and smoothness as to enable the retention of the surface shape and surface roughness of mold base, thus making it necessary to polish the film surface to a mirror surface at each time of film formation. Further, the diamond-like carbon film as described in Japanese Patent Application Kokai (Laid-Open) No. 183134/1986, being a diamond film formed according to an ion beam sputtering method (this film is hereinafter referred to as "i-carbon film" in some cases), has at low temperatures a high hardness (e.g. Vickers hardness of 3000 or above) and a smooth surface; however, at press molding temperatures of, for example, 545° C. or higher, the above film gets very brittle owing to its change from amorphous carbon to graphite and tends to peel off from the mold base; thus, the film is unsuitable as a releasing film of high temperature use. Moreover, since the ion beam sputtering apparatus is expensive, the above film formed with the apparatus is not desirable for use in the industrial production of a glass mold at a low cost.

The glassy carbon film (3) is oxidized easily and, owing to its structural weakness, is damaged easily, as described in Japanese Patent Application kokai (Laid-Open) No. 45613/1977 and U.S. Pat. No. 4098596.

The graphite film (4) is generally formed by thermal decomposition of $CH_4$, acetone or alcohol. Therefore, the film contains hydrogen therein and, at press molding temperatures of 600° C. or higher, gets soft and tends to peel off from the surface of the $\beta$-SiC film formed on the mold base.

As described above in detail, the diamond film (1), the diamond-like carbon film (2), the glass carbon film (3) and the graphite film (4) each conventionally used as a releasing film of a glass mold for producing a molded glass article by press molding, have been unsatisfactory in at least one of such properties as processability of the mold surface into an optical mirror surface, glass releasability, hardness, resistance to oxidation at high temperatures and peeling resistance.

SUMMARY OF THE INVENTION

An object of the present invention is to provide a glass mold having a releasing film satisfying the above properties.

Other objects will be apparent from the following description and the accompanying drawings.

The above objects have been achieved by processing a material for a base for a glass mold to be produced, into a mold base having a shape corresponding to that of a molded glass article to be produced from the mold, and then forming a hard carbon film on the mold base according to a sputtering method using an inert gas and graphite as a target at a mold base temperature of 250°–450° C.

Hence, the present invention resides in a process for producing a glass mold, comprising the steps of:

(a) processing a material for a base for a glass mold to be produced, into a mold base having a shape corresponding to that of a molded glass article to be produced from the mold, and then (b) forming a hard carbon film on the mold base according to a sputtering method using an inert gas and graphite as a target at a mold base temperature of 250°–450° C.

DETAILED DESCRIPTION OF THE INVENTION

As mentioned above, the present invention resides in a process for producing a glass mold, comprising the steps (a) and (b). The step (a) is a step for processing a material for a base for a glass mold to be produced, into a mold base having a shape corresponding to that of a molded glass article to be produced from the mold. As the mold base material, there is preferably used sintered SiC. There can also be used $Si_3N_4$, Si, $ZrO_2$, $TiO_2$, WC, a WC-Co alloy and various cermets. The mold base material is processed into a mold base having a shape corresponding to that of a molded glass article to be produced. For example, when the molded glass article is a double-convex lens, the mold base material is processed into a mold base having a concave portion corresponding to the shape of the lens.

Prior to the formation of a hard carbon film on the mold base, it is possible to form a SiC film on the mold base according to a chemical vapor deposition (CVD) method. This SiC film formed according to the CVD method serves to fill the pores present at the surface of the mold base and to allow the final mold to have an improved surface smoothness, i.e. a mirror surface, and ordinarily has a thickness of 5 μm or above. A β-SiC film having (111) plane orientation is preferred particularly. The formation of a SiC film according to the CVD method is preferred particularly when the mold base is made of sintered SiC.

As a preferable example of the step (a), sintered SiC as a mold base material was processed into a mold base having a shape corresponding to that of a molded glass article to be produced; then, a SiC film was formed on the mold base according to a CVD method. The typical conditions for SiC film formation according to the CVD method were 1500° C. (in-furnace temperature), 900 ml/min of a $SiCl_4$-$H_2$ mixture and 60 ml/min of $C_3H_8$ (gases), 300 Torr (in-furnace pressure) and 3 hours (deposition time). The SiC film formed was a thin β-SiC film having a thickness of 500 μm and (111) plane orientation.

The step (b) following the step (a) is a step for forming a hard carbon film on the mold base with a desired shape obtained in the step (a), according to a sputtering method. A preferable example of the step (b) is described below.

Figure 1:
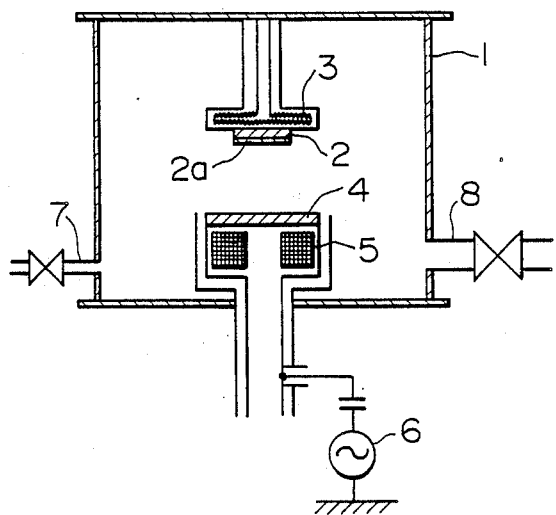
FIG. 1 is a schematic view of a sputtering apparatus used for forming a hard carbon film according to the process of the present invention.

FIG. 1 is a schematic view of a sputtering apparatus used for the formation of a hard carbon film on the mold base obtained in the step (a). In FIG. 1, numeral 1 denotes a vacuum chamber, and inside the vacuum chamber 1, a mold base 2 (a disc shape of 10 mm in diameter and 3 mm in thickness) made of sintered SiC and having a SiC film 2a at one side, is held by a mold base holder 3 (100 mmφ) doubling as a heater.

Further inside the vacuum chamber 1 is provided a target 4 (100 mmφ) made of graphite so that the target 4 faces the mold base 2 apart therefrom by 55 mm in a vertical distance. In FIG. 1, numeral 5 denotes a magnet; 6 denotes a RF electric source (a high frequency of 13.56 MHz was used); 7 denotes an inlet for inert gas (e.g. argon gas); and 8 denotes an exhaust port for making vacuum the inside of the vacuum chamber 1. As the inert gas, an argon gas is preferred particularly but other inert gas may be used if necessary.

In the step (b), it is essential that the mold base 2 be heated to a temperature of 250°-450° C. by the mold base holder 3 doubling as a heater. (The reasons for restricting the mold base temperature to the above range are explained later based on experiments.)

Figure 2:
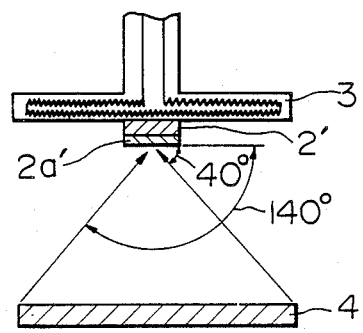
FIG. 2 is a schematic view showing a case that carbon atoms sputtered from a target are deposited on a mold base at an angle of 40°–140°.

Maintaining the inside of the vacuum chamber 1 at a vacuum of $5 \times 10^{-3}$ Torr through the exhaust port 8, an argon gas was introduced into the vacuum chamber 1 from the gas inlet 7, and a high frequency electric power of 6 W/cm² was applied by the RF electric source 6 to sputter the graphite target 4 and thereby to form a hard carbon film of 500-2000 Å in thickness on the SiC film 2a. Raman scattering analysis by the present inventors showed that hard carbon films of different types and different properties are obtained by changing an angle formed by (i) the movement direction of carbon atoms sputtered from the target 4 and (ii) the surface of the SiC film 2a on the mold base 2. That is, when in FIG. 2 the mold base was provided at the center of the mold base holder 3 as shown by a mold base 2', the carbon atoms sputtered from the target 4 were deposited on the SiC film 2a' at an angle perpendicular or almost perpendicular to the surface of the SiC film 2a' [40°-140° in the angle defined above], and the resulting hard carbon film [referred to as "hard carbon film (1)" in Tables 1 and 3] had a ($SP^2+SP^3$) structure and the Raman scattering spectrum of the resulting hard carbon film showed an almost flat peak from 1350 to 1570 cm$^{-1}$. From the analysis, this carbon film consists of amorphous diamond-like and graphite-like ultrafine particles. The property of the hard carbon film remained substantially unchanged even after the carbon film had been kept in a nitrogen atmosphere of 600° C. for 12 hours and then cooled.

Figure 3:
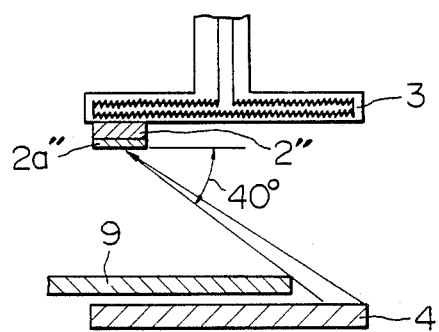
FIG. 3 is a schematic view showing another case that carbon atoms sputtered from a target are deposited on a mold base at an angle of 0°–40° or 140°–180°.

When in FIG. 3 the mold base was provided at the end of the mold base holder 3 as shown by a mold base 2", and a fixed shutter 9 was provided to shield the carbon atoms sputtering from the target 4 at an angle perpendicular or almost perpendicular to the surface of the SiC film 2a". The carbon atoms sputtered from the target 4 were deposited on the SiC film 2a" at an angle oblique to the mold base [0°-40° or 140°-180° in the angle defined above (below 40° in the case of the mold base 2")]. The resulting hard carbon film [referred to as "hard carbon film (2)" in Table 1] had two peaks at 1350 cm$^{-1}$ and 1590 cm$^{-1}$ and a concave portion therebetween according to Raman scattering spectrum. Therefore, it is concluded that the hard carbon film consisted mainly of graphite.

Each of the above two hard carbon films was found to contain no hydrogen, according to the infrared absorption analysis.

For these hard carbon films, adhesion to the underlying β-SiC film was measured using a diamond needle having a radius of curvature of 0.8 mm at the front end according to a scratch method. The results are shown in Table 1. The two hard carbon films were also measured for hardness using a micro-hardness meter. The results are shown in Table 1. As is clear from Table 1, the hard carbon film of the mold produced according to the present process had substantially the same adhesion and hardness even when the film had been kept in a nitrogen atmosphere of 600° C. for 12 hours and then cooled, as compared with when the film had been maintained at room temperature for 3 days, and the film caused almost no deterioration after the heat treatment. This is presumed to be because the gas used for sputtering contained no reactive gas (e.g. hydrogen) and accordingly the resulting film contained no hydrogen and because the temperature for film formation was high unlike the case of the formation of an i-carbon film.

In Table 1 were also shown the adhesions and hardnesses of a conventional diamond-like carbon film (i-carbon film) and a conventional thermal CVD film. As is clear from Table 1, the diamond-like carbon film (i-carbon film) showed peeling when subjected to the heat treatment of 600° C., and the thermal CVD film showed remarkable reduction in adhesion and hardness when subjected to the heat treatment of 600° C.

The hard carbon film of the mold produced according to the present process has an additional advantage. That is, when the removal of the film from the mold base becomes necessary owing to staining, etc. by repeated press molding, the film can be removed with relative ease, irrespective of the times of press molding, according to the plasma oxidation method. The glassy carbon film disappears during press molding owing to its poor oxidation resistance, and the i-carbon film is difficult to ash and requires a long time for film removal. In contrast, the hard carbon film of the mold produced according to the present process has a moderate oxidation resistance that it is not oxidized during press molding and can be removed easily by ashing.

Next, the reasons for restricting the mold base temperature to 250°–450° C. at the time of formation of a hard carbon film in the present process are described in detail based on the experimental results shown in Table 2. The mold base temperature during sputtering has close connection to the surface roughness and hardness of the hard carbon film formed. That is, as shown in Table 2, the hard carbon films formed at mold base temperatures higher than 450° C. have very poor surface roughnesses, the hard carbon films formed at mold base temperatures lower than 250° C. have very low hardnesses, and these films are practically unsuitable as a releasing film; in contrast, the hard carbon films formed at mold base temperatures of 250°–450° C. have satisfactory surface roughnesses and hardnesses.

Experiments were conducted by changing the argon gas pressure in a range of $5 \times 10^{-2}$ to $1 \times 10^{-3}$ Torr and the high frequency output in a range of 4 to 8 W/cm$^2$. However, surface roughness and adhesion were not affected substantially by these changes. Accordingly, the pressure of inert gas (e.g. argon gas) and the high frequency output are not critical in the present process.

Further, it was tried to form a film by reactive sputtering using a reactive gas which is a mixture of an argon gas, $CH_4$ and $H_2$. As is clear from Table 3, the use of a reactive gas was not effective and gave inferior results.

The hard carbon film of the mold produced according to the present process was measured for glass releasability. That is, a glass A [glass transition temperature (Tg): 475° C., sag temperature (Ts): 509° C., coefficient of thermal expansion ($\alpha$): $113 \times 10^{-7}$ cm/cm°C.] was subjected to press molding at a temperature of 545° C. and a pressure of 30 kg/cm$^2$ for 30 seconds in a nitrogen atmosphere, using a mold produced according to the present process; the molded glass was cooled to room temperature and taken out of the mold; this press molding procedure was repeated a plurality of times by using a new glass A in each procedure, until there occurred the first fusion bonding of the molded glass to the inner surface of the mold. The results are shown in Table 3. As is clear from Table 3, in the mold consisting of a sintered SiC mold base, a SiC film formed thereon according to a CVD method and a hard carbon film of 1000 Å in thickness formed on the SiC film, obtained according to the present process, there occurred no fusion bonding of glass to mold even after 200 times of the press molding; the first fusion bonding occurred at the 203rd time in the earliest case (mold sample No. 37) and at the 308th time in the latest case (mold sample No. 41); thus, excellent glass releasability was observed. The above mold showed similarly excellent glass releasability also when it was used for repeated press molding of another glass B [Tg: 565° C., Ts: 625° C., $\alpha$: $89 \times 10^{-7}$ cm/cm° C.](the press molding conditions (e.g. pressure, time) were same as above except that the temperature was 680° C.). As is clear from Table 3, in any sample of the above mold, there occurred no fusion bonding of glass to mold after 150 times of press molding procedures.

Meanwhile in a mold consisting of a sintered SiC base and a SiC film formed thereon and having no hard carbon film on the SiC film, fusion bonding of glass appeared at the 5th or 6th press molding procedure in the case of the glass A and at the 2nd or 3rd procedure in the case of the glass B.

In a mold having a film obtained by reactive sputtering using a reactive mixed gas consisting of an argon gas, $CH_4$ and $H_2$, fusion bonding of glass appeared at the 41st to 67th press molding procedure in the case of the glass A and at the 40th to 58th procedure in the case of the glass B. In a mold having a conventional i-carbon film, fusion bonding of glass appeared at the 10th to 22nd press molding procedure in the case of the glass A and at the 5th to 6th procedure in the case of the glass B. In a mold having a conventional CVD film, fusion bonding appeared at the 80th to 113th press molding procedure in the case of the glass A and at the 31st to 53rd procedure in the case of the glass B.

TABLE 1

| Releasing film | Releasing film-forming conditions | Mold sample No. | Adhesion (newton) After room temp. storage | Adhesion (newton) After heat treatment | Vickers hardness (Hardness measured using Shimadzu Micro-hardness Meter was converted to Vickers hardness) After room temp. storage | Vickers hardness After heat treatment |
|---|---|---|---|---|---|---|
| Hard carbon film (1) obtained according to present invention | Sputtering Graphite Angle: 40–140° 300° C. Film thickness: 1000 Å | 1 | 62 | 59 | 2500 | 2200 |
| | | 2 | 60 | 61 | 2600 | 2400 |
| | | 3 | 65 | 61 | 2700 | 2300 |
| Hard carbon film (2) obtained according to present invention | Sputtering Graphite Angle: 0–40° or 140–180° 300° C. Film thickness: 1000 Å | 4 | 37 | 35 | 1700 | 1500 |
| | | 5 | 32 | 32 | 1900 | 1700 |
| Diamond-like carbon film (i-carbon film) | Ion plating Organic gas Room temperature Film thickness: 1000 Å | 6 | 72 | Peeled | 3100 | Peeled |
| | | 7 | 74 | Peeled | 3400 | Peeled |
| | | 8 | 68 | Peeled | 3000 | Peeled |
| Film by thermal CVD | Filament Organic gas | 9 | 52 | 17 | 2700 | 1200 |

TABLE 1-continued

| Releasing film | Releasing film-forming conditions | Mold sample No. | Adhesion (newton) After room temp. storage | Adhesion (newton) After heat treatment | Vickers hardness (Hardness measured using Shimadzu Micro-hardness Meter was converted to Vickers hardness) After room temp. storage | Vickers hardness After heat treatment |
|---|---|---|---|---|---|---|
| | 800° C. | 10 | 49 | 19 | 2200 | 500 |
| | Film thickness: 1000 Å | 11 | 41 | 5 | 3100 | 1300 |
| Timing of measurement* | | | I | II | I | II |

*I: After 3 days storage at room temperature after film formation.
II: On the third day after maintaining in a nitrogen atmosphere of 600° C. for 12 hours after film formation, followed by natural cooling.

TABLE 2

| Mold base temperature at film formation (°C.) | Mold sample No. | Surface roughness by WYKO interferometer P.V. value*1 (Å) | | | R.M.S. value*2 (Å) | | | Vickers hardness (Hardness measured using Shimadzu Micro-hardness Meter was converted to Vickers hardness) | | |
|---|---|---|---|---|---|---|---|---|---|---|
| 200 | 10 to 12 | 22.0 | 24.3 | 18.2 | 3.2 | 3.0 | 3.5 | 250 | 300 | 300 |
| 250 | 13 to 15 | 22.6 | 18.4 | 19.8 | 3.6 | 3.9 | 4.2 | 1700 | 1900 | 2100 |
| 300 | 16 to 18 | 21.3 | 24.1 | 18.6 | 3.8 | 4.3 | 4.3 | 2200 | 2400 | 2500 |
| 350 | 19 to 21 | 25.4 | 26.8 | 21.2 | 4.2 | 4.6 | 3.5 | 2600 | 2300 | 2500 |
| 400 | 22 to 24 | 28.3 | 22.3 | 30.1 | 5.6 | 5.0 | 4.8 | 2500 | 2600 | 2600 |
| 450 | 25 to 27 | 42.6 | 35.6 | 48.9 | 7.6 | 8.8 | 6.9 | 2500 | 2700 | 2800 |
| 500 | 28 to 30 | 130.2 | 152.1 | 147.5 | 18.6 | 20.5 | 23.8 | 2500 | 2700 | 2600 |

*1 P. V. value refers to a peak-to-valley value.
*2 R. M. S. value refers to a root mean square value.

TABLE 3

| Mold | Releasing film-forming conditions | Glass releasability | | | |
|---|---|---|---|---|---|
| | | Mold sample No. | Glass A | Mold sample No. | Glass B |
| Mold consisting only of sintered SiC base and SiC film formed thereon according to CVD method | — | 31 | Fusion-bonded at the 6th time | 34 | Fusion-bonded at the 2nd time |
| | | 32 | Fusion-bonded at the 5th time | 35 | Fusion-bonded at the 3rd time |
| | | 33 | Fusion-bonded at the 5th time | 36 | Fusion-bonded at the 3rd time |
| Mold having hard carbon film (1) obtained according to present process | Sputtering Graphite Ar gas 300° C. Film thickness: 1000 Å | 37 | Fusion-bonded at the 203rd time | 42 | Fusion-bonded at the 200th time |
| | | 38 | Fusion-bonded at the 256th time | 43 | Fusion-bonded at the 153rd time |
| | | 39 | Fusion-bonded at the 302nd time | 44 | Fusion-bonded at the 252nd time |
| | | 40 | Fusion-bonded at the 251st time | 45 | Fusion-bonded at the 303rd time |
| | | 41 | Fusion-bonded at the 308th time | 46 | Fusion-bonded at the 207th time |
| Mold having film obtained by reactive sputtering | Same as above except that the Ar gas has been replaced by a mixed gas consisting of Ar, CH$_4$ and H$_2$. | 47 | Fusion-bonded at the 41st time | 50 | Fusion-bonded at the 40th time |
| | | 48 | Fusion-bonded at the 67th time | 51 | Fusion-bonded at the 58th time |
| | | 49 | Fusion-bonded at the 52nd time | 52 | Fusion-bonded at the 41st time |
| Mold having i-carbon film | Ion plating Organic gas Room temperature Film thickness: 1000 Å | 53 | Fusion-bonded at the 10th time | 56 | Fusion-bonded at the 5th time |
| | | 54 | Fusion-bonded at the 22nd time | 57 | Fusion-bonded at the 5th time |
| | | 55 | Fusion-bonded at the 15th time | 58 | Fusion-bonded at the 6th time |
| Mold having CVD film | Filament Organic gas 800° C. | 59 | Fusion-bonded at the 113rd time | 62 | Fusion-bonded at the 53rd time |
| | | 60 | Fusion-bonded at the 90th time | 63 | Fusion-bonded at the 31st time |
| | | 61 | Fusion-bonded at the 80th time | 64 | Fusion-bonded at the 44th time |

As understood from the above description, according to the present process for producing a glass mold, there can be formed a hard carbon film having excellent adhesion to the mold base and excellent hardness and being unliable to cause fusion bonding to a molded glass article; accordingly, the resulting mold has excellent durability and excellent glass releasability. The present process has an additional advantage that since the hard carbon film can be easily removed by the plasma oxidation method, the mold can be reclaimed and reused a plurality of times by repeating film removal and subsequent film formation.

The above-described embodiments are just examples of the present invention, and therefore, it will be apparent for those skilled in the art that many modifications and variations may be made without departing from the scope of the present invention.

What is claimed is:

1. A process for producing a glass mold, said process comprising the steps of:
   (a) processing a material for a base having a surface for a glass mold to be produced into a mold base having a shape corresponding to that of a molded glass article to be produced from the mold;
   (b) forming a $\beta$-SiC having (111) plane orientation on the surface of the mold base according to a chemical vapor deposition (CVD) method; and
   (c) forming a hard carbon film on the mold base according to a sputtering method using an inert gas and graphite as a target at a mold base temperature of 250°–450° C.

2. A process according to claim 1, wherein the mold base material is sintered SiC.

3. A process according to claim 1, wherein the inert gas is argon gas.

4. A process according to claim 1, wherein a hard carbon film of different type and different property is obtained by changing an angle formed by the movement direction of carbon atoms sputtered from the target and the surface of the mold base.

5. A process according to claim 4, wherein sputtered carbon atoms are deposited on the mold base surface at an angle of 40°–140° to obtain a hard carbon film consisting of diamond-like and graphite-like ultrafine particles.

6. A process according to claim 4, wherein sputtered carbon atoms are deposited on the mold base surface at an angle of 0°–40° or 140°–180° to obtain a hard carbon film consisting mainly of graphite.

* * * * *